US007230416B2

(12) United States Patent
Huang et al.

(10) Patent No.: US 7,230,416 B2
(45) Date of Patent: Jun. 12, 2007

(54) INSPECTING APPARATUS FOR LIQUID CRYSTAL DISPLAYS

(75) Inventors: Chung-Sung Huang, Miao-Li (TW); Eadle Chen, Miao-Li (TW); Xiao-Li Jin, ShenZhen (CN)

(73) Assignees: Innocome Technology (Shenzhen) Co., Ltd., Shenzhen (CN); Innolux Display Corp., Miao-Li (TW)

(*) Notice: Subject to any disclaimer, the term of this patent is extended or adjusted under 35 U.S.C. 154(b) by 0 days.

(21) Appl. No.: 11/064,041

(22) Filed: Feb. 22, 2005

(65) Prior Publication Data

US 2005/0184724 A1 Aug. 25, 2005

(30) Foreign Application Priority Data

Feb. 20, 2004 (TW) .............................. 93104235 A

(51) Int. Cl.
*G01R 31/28* (2006.01)
*G01R 31/00* (2006.01)

(52) U.S. Cl. .................................... 324/158.1; 324/770

(58) Field of Classification Search ................ 324/770, 324/755, 158.1; 269/69, 289 R
See application file for complete search history.

(56) References Cited

U.S. PATENT DOCUMENTS 6,009,617 A * 1/2000 Fan ............................. 29/714
6,019,050 A * 2/2000 Ranta ............................ 108/6
6,259,265 B1 * 7/2001 Han et al. .................... 324/761
6,486,927 B1 * 11/2002 Kim ............................... 349/1
6,583,643 B2 * 6/2003 Lin ............................. 324/770
6,585,248 B2 * 7/2003 Baud ........................... 269/296
6,809,544 B2 * 10/2004 Liao et al. .................. 324/770
6,876,211 B2 * 4/2005 Chung et al. ............... 324/754
6,879,180 B2 * 4/2005 Iwata et al. ................. 324/770

FOREIGN PATENT DOCUMENTS

TW 499 140 8/2002

* cited by examiner

*Primary Examiner*—Ha Tran Nguyen
*Assistant Examiner*—Roberto Velez
(74) *Attorney, Agent, or Firm*—Wei Te Chung

(57) ABSTRACT

An inspecting apparatus (20, 40, 50, 60) for liquid crystal displays includes a base plate (21, 41), a connecting device (200, 400) mounted on the base plate, a working table (25, 45, 55, 65) supported on the connecting device, and an electrical holding device (29) fixed to the working table. The electrical holding device can hold a mains switch (33) and an electrical connector (31) that is used to connect with leads of the LCD. Because the inspecting apparatus includes the electrical holding device for holding the electrical connector, operators can connect leads of the LCD and the electrical connector easily using a single hand. After that, operators can conveniently turn on the mains switch because the mains switch is adjacent to the electrical connector.

5 Claims, 6 Drawing Sheets

INSPECTING APPARATUS FOR LIQUID CRYSTAL DISPLAYS

BACKGROUND OF THE INVENTION

1. Field of the Invention

The present invention relates to inspecting apparatuses for liquid crystal displays (LCDs).

2. Background of the Invention

A process of fabricating an LCD generally comprises forming an LCD panel (known as a "cell process"), and inspecting the LCD panel with other parts such as a backlight module, frame, etc. (known as a "modular process"). After that, the LCD is inspected by an inspecting apparatus, which mainly has the functions of holding, turning over, and electrically testing the LCD under assembly.

Referring to FIG. 7, this shows a conventional inspecting apparatus for LCDs as disclosed in Taiwan Patent No. 499, 140 issued on Aug. 11, 2002. The inspecting apparatus 10 includes a base frame 11, a connecting rod 12, and a supporting plate 14. The base frame 11 is located on a working platform (not shown). The connecting rod 12 has an adjustable component 13 that is used to change an angle of the supporting plate 14 relative to the base frame 11. The supporting plate 14 has a rectangular shape, and connects with the base frame 11 and the connecting rod 12. The supporting plate 14 has a flange 15 that is used to hold an LCD in place. Two cutouts 16 are defined in two corners of the supporting plate 14. The cutouts 16 are used to expediently allow power plugs of the LCD to be connected to an external electrical source.

In use of the inspecting apparatus 10, an operator connects the power plugs to the electrical source using his left and right hands respectively. This is unduly troublesome and time-consuming. Moreover, if the electrical source is located far away from the operator, the operating time is further increased.

What is needed is an inspecting apparatus that can shorten the operating time.

SUMMARY

In a preferred embodiment, an inspecting apparatus for liquid crystal displays includes a base plate, a connecting device mounted on the base plate, a working table supported on the connecting device, and an electrical holding device fixed to the working table. The electrical holding device can hold a mains switch and an electrical connector that is used to connect with leads of a liquid crystal display.

Because the inspecting apparatus includes the electrical holding device for holding the electrical connector, an operator can connect the leads of the LCD and the electrical connector easily using a single hand. After that, the operator can conveniently turn on the mains switch, because the mains switch is adjacent to the electrical connector.

Other advantages and novel features of the present invention will become more apparent from the following detailed description when taken in conjunction with the accompanying drawings, in which:

DETAILED DESCRIPTION OF PREFERRED EMBODIMENTS

Reference will now be made to the drawings to describe the present invention in detail.

Figure 1:
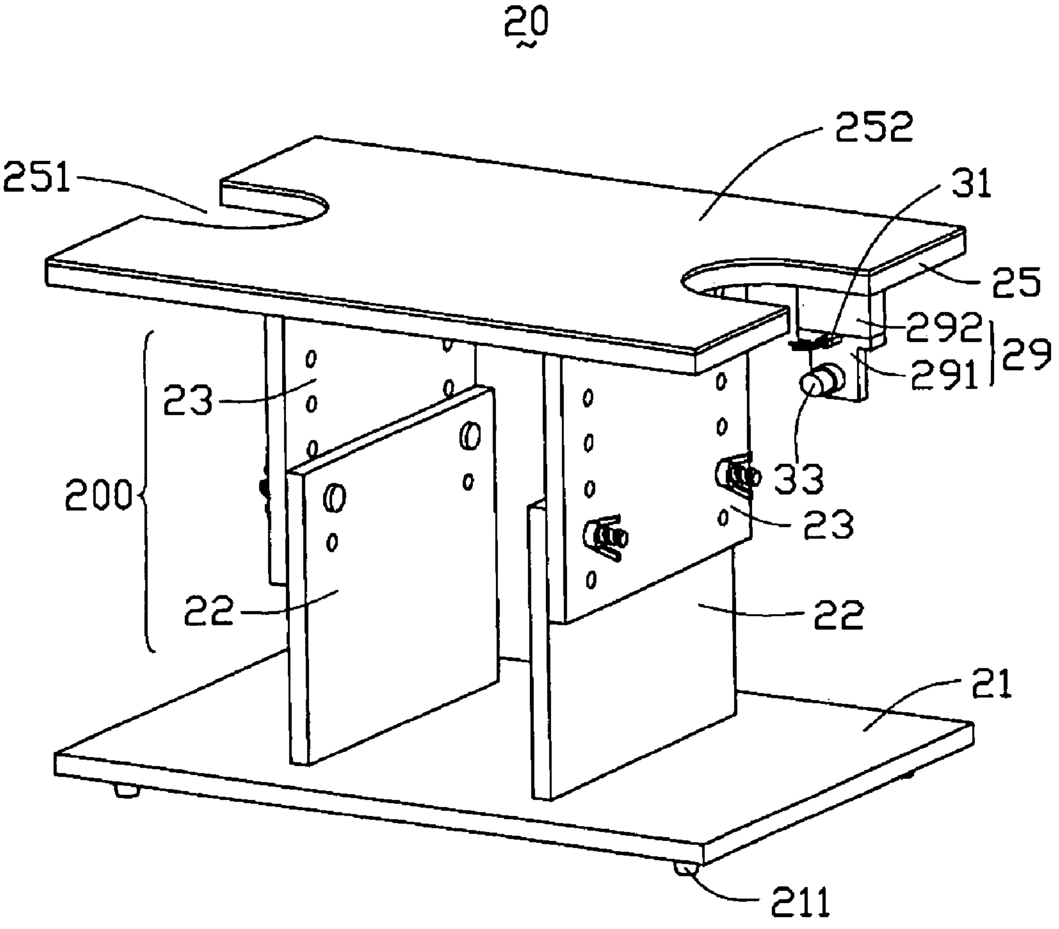
FIG. 1 is an isometric view of an inspecting apparatus according to a first embodiment of the present invention.
Figure 2:
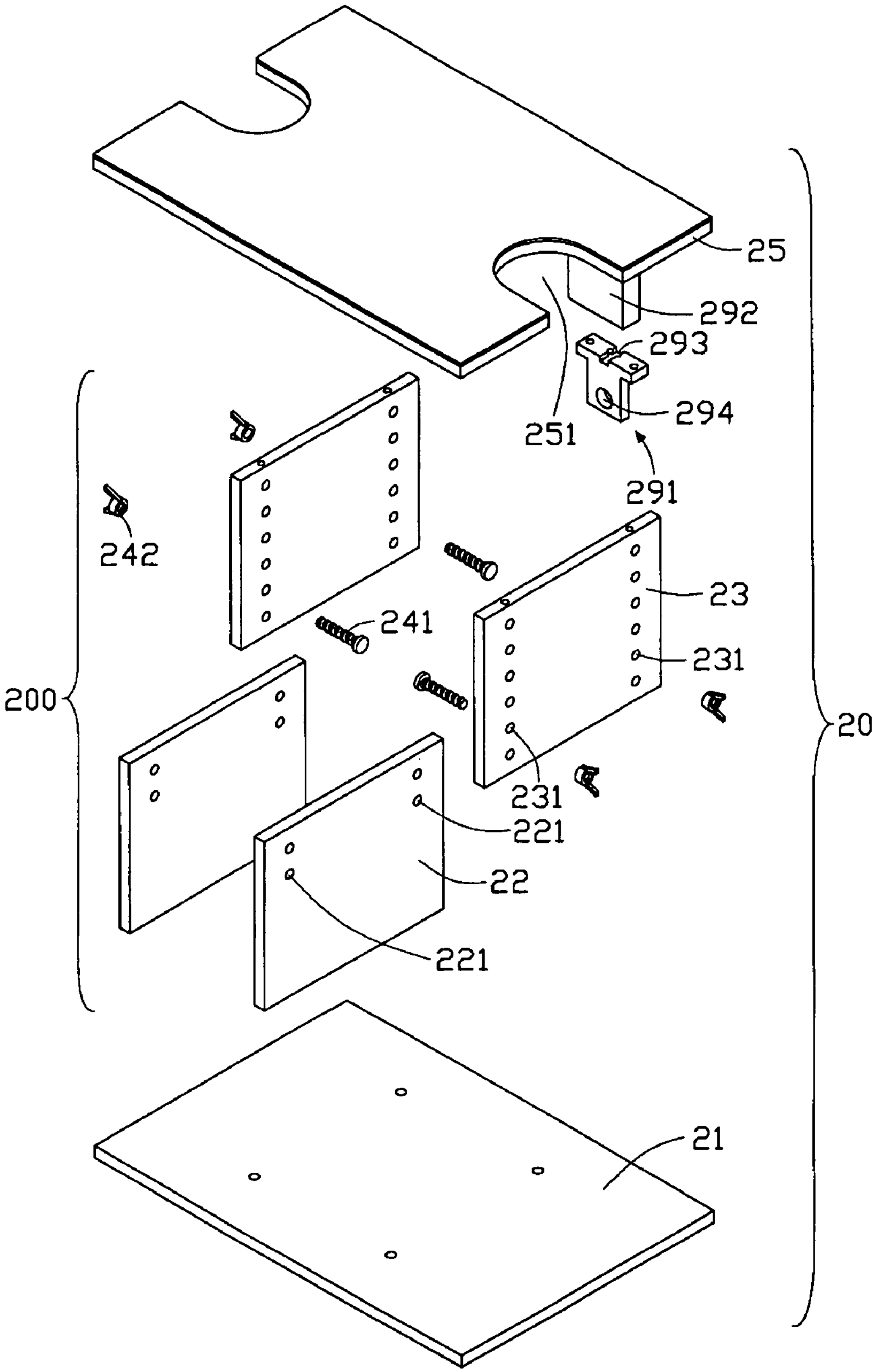
FIG. 2 is an exploded view of the inspecting apparatus of FIG. 1.

FIG. 1 is an isometric view of an inspecting apparatus 20 according to the first embodiment of the present invention, and FIG. 2 is an exploded view thereof. In this embodiment, the inspecting apparatus 20 includes a base plate 21, a connecting device 200 mounted on the base plate 21, a working table 25, and an electrical holding device 29. The connecting device 200 interconnects the working table 25 and the base plate 21, and is used to adjust the height of the working table 25 relative to the base plate 21.

Four standoffs 211 are fixed to four corners of an underside of the base plate 21 respectively, for supporting the inspecting apparatus 20 on a standard table (not shown). To prevent the standoffs 211 from sliding on the standard table or scratching a surface of the standard table, the standoffs 211 are made of rubber material.

Referring particularly to FIG. 2, the connecting device 200 includes two opposite first supporting plates 22, two opposite second supporting plates 23, and a plurality of locking devices (not labeled) used to fix the first supporting plates 22 and the second supporting plates 23 together. The first supporting plates 22 are vertically fixed to the base plate 21 by screws (not shown). Each of the first supporting plates 22 defines four first through holes 221. The first through holes 221 are symmetrically arranged in top corners of the first supporting plate 22, in two vertical lines respectively. The second supporting plates 23 are vertically fixed to an underside of the working table 25 by screws (not shown). Each of the second supporting plates 23 defines two lines of vertically arranged second through holes 231. A transverse distance between each two opposite second through holes 231 is the same as a transverse distance between each two opposite first through holes 221. Each locking device includes a screw 241 and a wing nut 242, which cooperate to connect and fix the corresponding first supporting plate 22 and second supporting plate 23 together. The height of the inspecting apparatus 20 can be adjusted by aligning desired transversely opposite second through holes 231 with desired transversely opposite first through holes 221.

The working table 25 defines two opposite first cutouts 251 which are used to expediently place an LCD (not shown) on the working table 25 and lift the LCD off from the working table 25. To protect the LCD from colliding with or rubbing the working table 25, a rubber cushion 252 is placed on the working table 25. The rubber cushion 252 can also prevent the generation of static electricity.

The electrical holding device 29 is fixed to an underside of the working table 25, and is adjacent to one of the first cutouts 251. The electrical holding device 29 includes a quadrate block 292 fixed to the underside of the working table 25, and a T-shaped block 291 fixed to an underside of the quadrate block 292 through a screw (not shown). The T-shaped block 291 defines a receiving slot 293 and a holding hole 294. The receiving slot 293 is used to receive and hold an electrical connector 31 that is connected to leads of the LCD. The holding hole 294 is used to hold a mains switch 33.

Because the inspecting apparatus 20 includes the electrical holding device 29 for holding the electrical connector 31 under the working table 25, an operator can connect leads of a liquid crystal display and the electrical connector 31 easily using a single hand. After that, the operator can conveniently turn on the mains switch 33, because the mains switch 33 is adjacent to the electrical connector 31.

Figure 3:
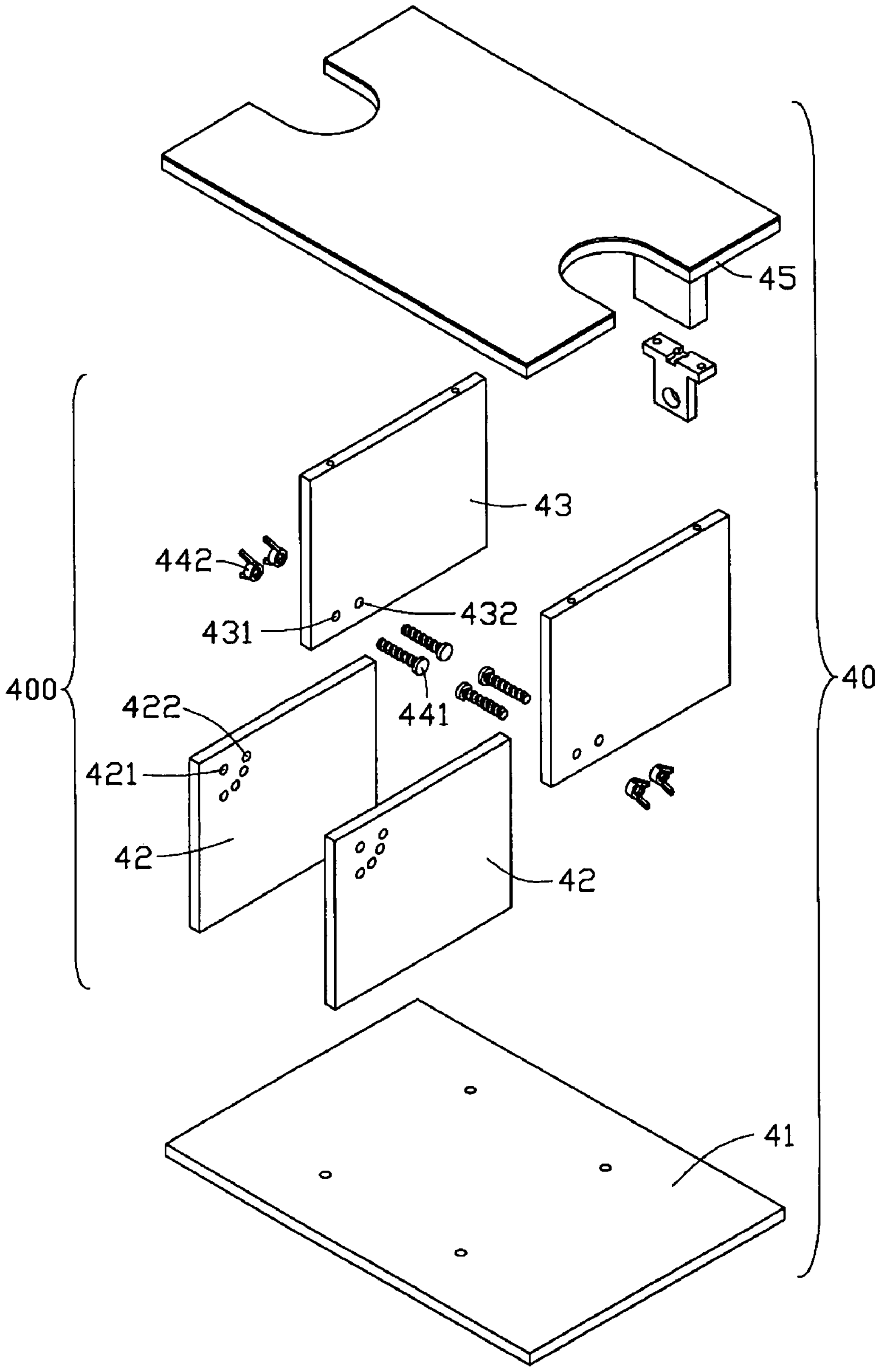
FIG. 3 is an exploded, isometric view of an inspecting apparatus according to a second embodiment of the present invention.

Referring to FIG. 3, this shows an exploded view of an inspecting apparatus 40 according to the second embodiment of the present invention. The inspecting apparatus 40 has substantially the same structure as that of the inspecting apparatus 20 of the first embodiment. However, a connecting device 400 of the inspecting apparatus 40 is different from the connecting device 200 of the inspecting apparatus 20. The connecting device 400 interconnects a working table 45 and a base plate 41, and is used to adjust an angle of the working table 45 relative to the base plate 41. The connecting device 400 includes two opposite first supporting plates 42, two opposite second supporting plates 43, and a plurality of locking devices (not labeled) used to fix the first supporting plates 42 and the second supporting plates 43 together. The first supporting plates 42 are vertically fixed to the base plate 41 by screws (not shown). Each of the first supporting plates 42 defines a first through hole 421 and a plurality of second through holes 422. The first through hole 421 is located in a front upper corner of the first supporting plate 42. The second through holes 422 are arranged in an arc around the first through hole 421. A top one of the third through holes 422 and the first through hole 421 are in a same horizontal plane. The second supporting plates 43 are vertically fixed to an underside of the working table 45 by screws (not shown). Each of the second supporting plates 43 defines a third through hole 431 and a fourth through hole 432. The third and fourth through holes 431, 432 are horizontally arranged in a front lower corner of the second supporting plate 43. A transverse distance between the third and fourth through holes 431, 432 is the same as a distance between the first through hole 421 and each second through hole 422. Each locking device includes a screw 441 and a wing nut 442, which cooperate to connect and fix the corresponding first supporting plate 42 and second supporting plate 43 together. The inclined angle of the working table 45 can be adjusted by aligning the third through hole 431 with the first through hole 421 and aligning the fourth through hole 432 with a desired second through hole 422.

Figure 4:
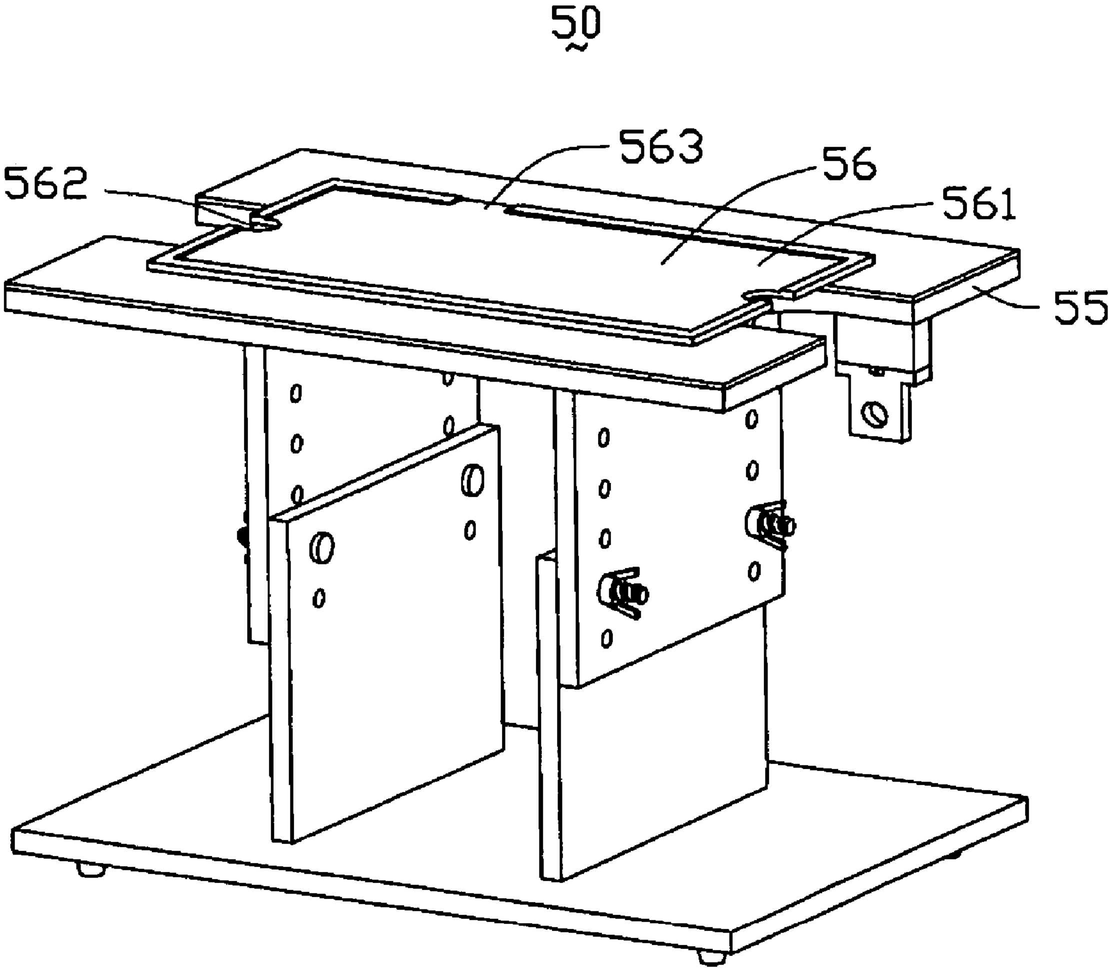
FIG. 4 is an isometric view of an inspecting apparatus according to a third embodiment of the present invention.

Referring to FIG. 4, this shows an isometric view of an inspecting apparatus 50 according to the third embodiment of the present invention. The assembling apparatus 50 has essentially the same structure as that of the assembling apparatus 20 of the first embodiment. However, the assembling apparatus 50 includes a holding device 56 placed on a working table 55. The holding device 56 defines a shallow, central recess 561 used to receive and hold an LCD. Two second cutouts 562 are defined at two opposite sides of the holding device 56 respectively. An opening 563 is defined in a peripheral wall of the holding device 56, in communication with the recess 561. A flexible printed circuit board (FPC) attached to the LCD can smoothly extend out of the holding device 56 through the recess 561, without being bent. The second cutouts 562 are used to expediently place the LCD in the recess 561 and lift the LCD out from the recess 561. With this configuration, when the size of the LCD is changed, a manufacturer need only change the holding device 56, with no need to change other parts of the assembling apparatus 50. Thus, the costs of mass production are reduced.

Figure 5:
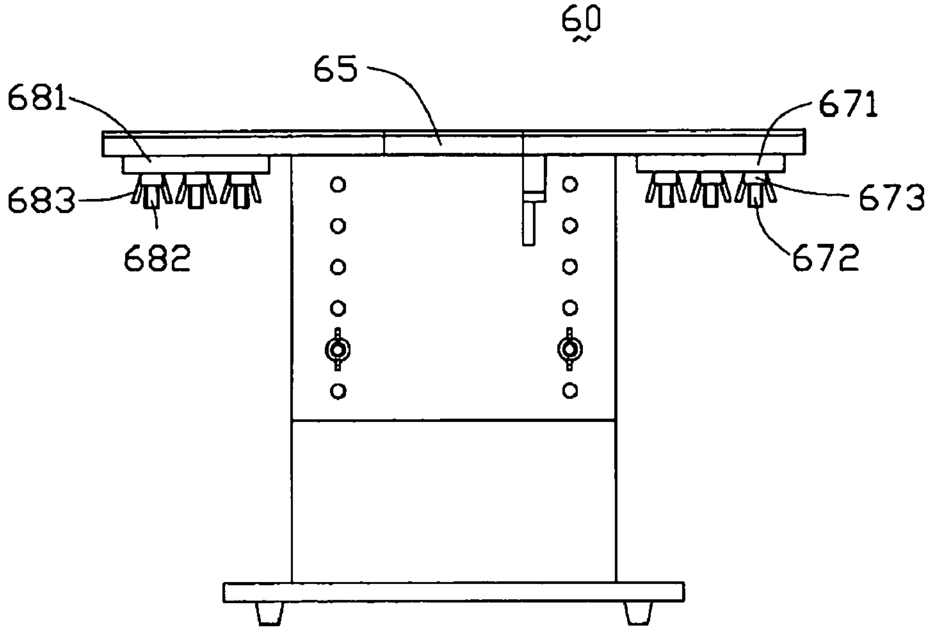
FIG. 5 is a side plan view of an inspecting apparatus according to a fourth embodiment of the present invention.
Figure 6:
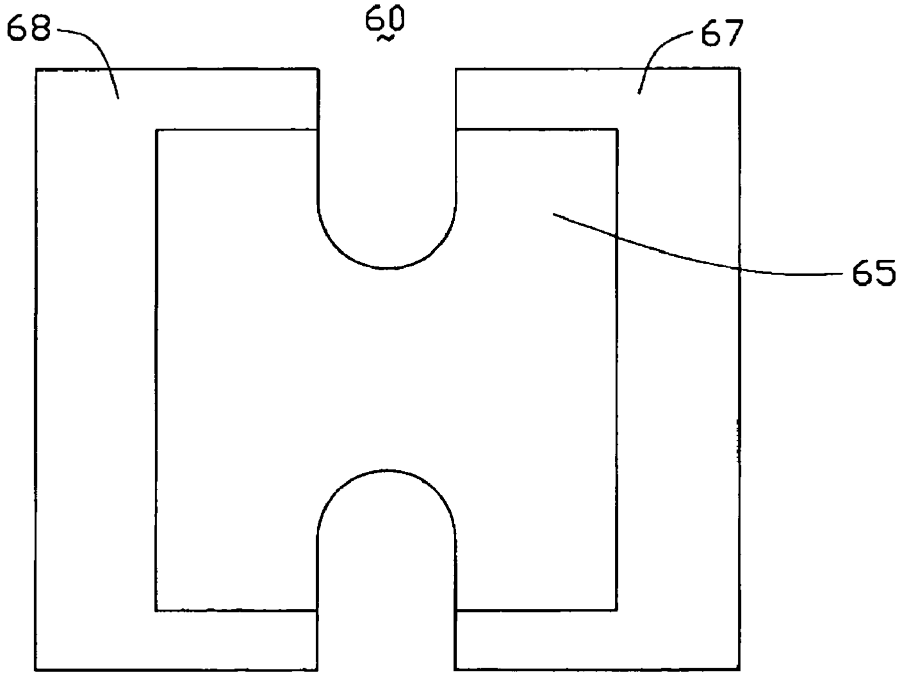
FIG. 6 is a top plan view of the inspecting apparatus of FIG. 5.
Figure 7:
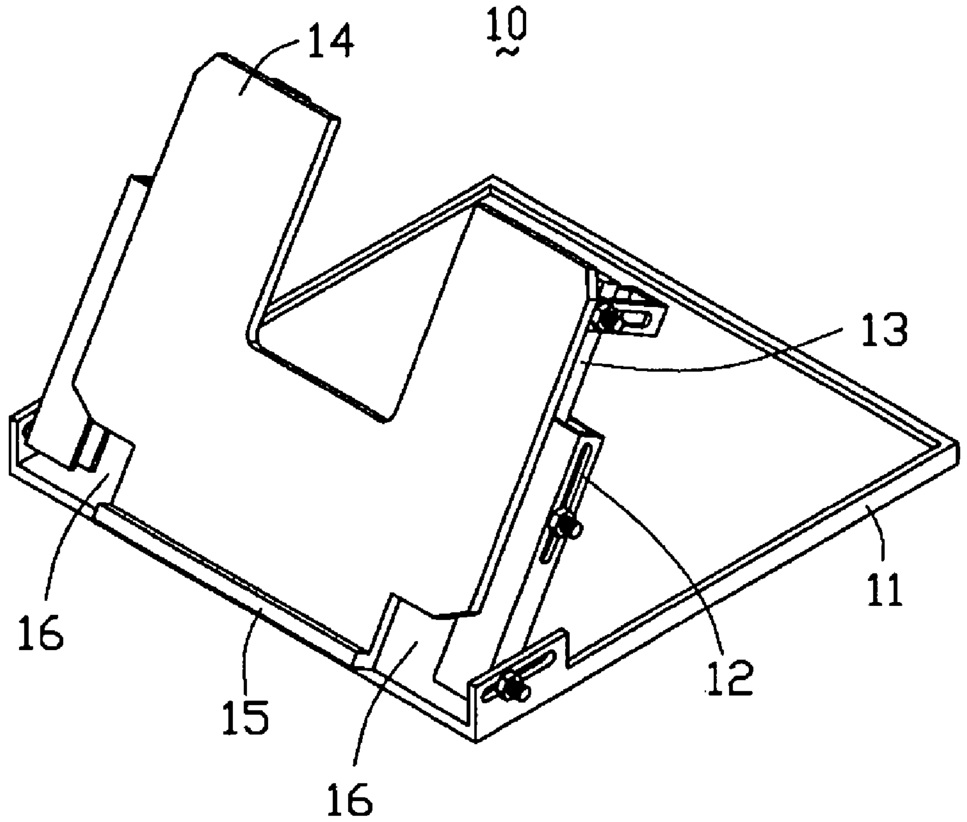
FIG. 7 (PRIOR ART)
FIG. 7 is an isometric view of a conventional inspecting apparatus.

Referring to FIG. 5, this shows an inspecting apparatus 60 in accordance with the fourth embodiment of the present invention. In this embodiment, the inspecting apparatus 60 has essentially the same structure as that of the inspecting apparatus 20 of the first embodiment. However, the inspecting apparatus 60 includes two expansion tables 67, 68 respectively fixedly connected with two opposite sides of a working table 65. A plurality of screws 672 extend down through the expansion table 67 and a connecting plate 671, respectively. A plurality of screws 672 extend down through the working table 65 and the connecting plate 671, respectively. A plurality of wing nuts 673 are attached on the screws 672, so that the expansion table 67 is fixedly connected with the working table 65 via the connecting plate 671. A plurality of screws 682 extend down through the expansion table 68 and the connecting plate 681, respectively. A plurality of screws 682 extend down through the working table 65 and the connecting plate 681, respectively. A plurality of wing nuts 683 are attached on the screws 682, so that the expansion table 68 is fixedly connected with the working table 65 via the connecting plate 681. The expansion tables 67, 68 and the working table 65 together constitute a larger table for placing and assembling of an LCD with a larger size.

The present invention may have other embodiments as follows. The number of the first supporting plates may be one, or more than two. A gear configuration may replace the locking devices and through holes of the second embodiment. The connecting devices of the first and second embodiments respectively may be integrated into a single connecting device which can adjust the height and the angle of the working table relative to the base plate.

It is understood that the above-described embodiments are intended to illustrate rather than limit the invention. Variations may be made to the embodiments without departing from the spirit of the invention as claimed. The above-described embodiments illustrate the scope of the invention, but are not intended to restrict the scope of the invention.

What is claimed is:

1. An inspection apparatus, comprising: a base plate; a working table configured for supporting a liquid crystal display to be inspected; a connecting device mounted on the base plate and interconnecting the working table and the base plate, the connecting device comprising a first supporting member, a second supporting member, and a pair of locking devices, wherein the first supporting member defines two lines of first through holes, the second supporting member connects with the working table, and defines two lines of second through holes, and each of the locking devices is used to fix the first supporting member and the second supporting member together at selected of the first and second through holes; and a holding device fixed to the working table and configured for holding mains switch and for holding an electrical connector that is used to connect with leads of said liquid crystal display; wherein the connecting device is used to adjust a height of the working table relative to the base plate.

2. The inspecting apparatus as recited in claim 1 wherein each or the locking devices comprises a screw and a nut, the screw extending through the selected first through hole and the selected second through hole, and the nut engaging on the screw.

3. An inspection apparatus, comprising: a base plate; a working table configured for supporting a liciuid crystal display to be inspected; a connecting device mounted on the base plate and interconnecting the working table and the base plate, the connecting device comprising a first supporting member, a second supporting member, and a pair of locking devices, wherein the first supporting member defines a first through hole and a plurality of second through holes, the second through holes are arranged in an arc around the first through hole, the second supporting member connects with the working table, and defines a third through hole and a fourth through hole, and the locking devices are used to fix the first supporting member and the second-supporting member together at the first through hole and the third through hole, and at a selected one of the second through holes and the fourth through hole; and a holding device fixed to the working table and configured for holding mains switch and for holding an electrical connector that is used to connect with leads of said liquid crystal display; wherein the connecting device is used to adjust a height of the working table relative to the base plate.

4. The inspecting apparatus as recited in claim 3, wherein each of the locking devices comprises a screw and a nut, the screw extending through the first through hole and the third through hole, or through tho selected one of the second through holes and the fourth through hole, and the nut engaging on the screw.

5. An inspection apparatus, comprising: an upper portion; a lower portion; and a connecting device interconnecting the upper portion and the lower portion; wherein the connecting device comprises a first supporting member supporting the upper portion, a second supporting member supported on the lower portion, and a pair of locking devices, the first supporting member defines a first through hole and a plurality of second through holes, the second through holes are arranged in an arc around the first through hole, the second supporting member connects with the working table, and defines a third through hole and a fourth through hole, and the locking devices are used to fix the first supporting member and the second supporting member together at the first through hole and the third through hole, and at a selected one of the second through holes and the fourth through hole; and a holding device fixed to the upper portion and configured for holding mains switch and for holding an electrical connector that is used to connect with leads of a liguid crystal display; wherein the connecting device is used to adiust a height of the upper portion relative to the lower portion.

* * * * *